United States Patent [19]
Tang et al.

[11] Patent Number: 5,744,928
[45] Date of Patent: Apr. 28, 1998

[54] DIGITAL LOCKED LOOP

[75] Inventors: Shi-ming Tang; Sang-yong Lee, both of Kyonggi-do, Rep. of Korea

[73] Assignee: Samsung Electronics Co., Ltd., Rep. of Korea

[21] Appl. No.: 638,745

[22] Filed: Apr. 29, 1996

[30] Foreign Application Priority Data

Oct. 19, 1995 [KR] Rep. of Korea ............... 95-36269

[51] Int. Cl.[6] ................................................ H02P 7/00
[52] U.S. Cl. ................................................ 318/610; 318/439
[58] Field of Search ........................... 318/610, 254, 318/439, 138, 615–619, 54, 58, 59, 61, 85; 388/842–847, 906, 911, 804–806; 364/161–163, 174, 175; 360/73.01, 73.03, 73.08, 73.09, 73.14; 386/84–87; 455/265; 331/25

[56] References Cited

U.S. PATENT DOCUMENTS

| | | | |
|---|---|---|---|
| 4,412,163 | 10/1983 | Angersbach et al. | 318/567 |
| 4,707,650 | 11/1987 | Bose | 318/685 |
| 5,034,668 | 7/1991 | Bausch | 318/254 |
| 5,379,223 | 1/1995 | Asplund | 364/424.013 |
| 5,465,381 | 11/1995 | Schmidt et al. | 395/439 |
| 5,477,103 | 12/1995 | Romano et al. | 318/601 |

*Primary Examiner*—Jonathan Wysocki
*Attorney, Agent, or Firm*—Cushman Darby & Cushman IP Group of Pillsbury Madison & Sutro LLP

[57] ABSTRACT

A digital locked loop uses feedback to maintain an output digital signal in a specific digital relationship with a reference digital signal. The digital locked loop can lock an input digital signal according to a reference digital signal by using a digital counter, a resister and an arithmetic logic circuit instead of a phase locked loop and a frequency locked loop in motor drive integrated circuit for permanent magnetic brushless DC multi-phase motor drive applications. The circuit is designed not to use a voltage-controlled oscillator VCO and can be extended to broader applications such as digital data communications, digital image processing, and in the multi-media industry.

13 Claims, 9 Drawing Sheets

| Input | | Output | |
|---|---|---|---|
| S | C | Q | $\bar{Q}$ |
| 1 | 0 | 1 | 0 |
| 0 | 1 | 0 | 1 |

5,744,928

DIGITAL LOCKED LOOP

BACKGROUND OF THE INVENTION

1. Field of the Invention

The present invention relates to a digital locked loop. More particularly, the present invention relates to a digital locked loop which uses feedback to maintain an output digital signal in a specific digital relationship with a reference digital signal through the use of a digital counter, a register and an arithmetic logic circuit instead of a phase locked loop circuit or a frequency locked loop circuit.

2. Description of the Related Art

Phase locked loop systems and frequency locked loop systems are used in many ares of electronics to control the phase and frequency of a signal. However, one major disadvantage with phase locked loop circuits is that they only work within a limited range of frequencies, and may lose their lock on the particular frequency if a significant mechanical or electrical disturbance is applied to the circuit.

To overcome this problem frequency locked loop systems and phase locked loop systems may be combined to form one system having two loops. One such system is described in U.S. Pat. No. 5,272,534, entitled "Television Receiver with Automatic Tuning Control", which issued May 5, 1992. In this patent, a television receiver has a phase detector and frequency detector being commonly coupled to a loop branch having two loops in common and incorporating a loop filter and a voltage-controlled oscillator.

In addition, U.S. Pat. No. 4,929,918, entitled "Setting and Dynamically Adjusting VCO Free-running Frequency at System Level" which issued Jun. 7, 1989, proposes to use a voltage-controlled oscillator to form a part of an interconnected phase-locked loop and frequency locked loop.

Further, U.S. Pat. No. 4,890,071, entitled "Signal Generator Utilizing a Combined Phase Locked and Frequency Locked Loop", which issued on Dec. 26, 1989, proposed a technique in which a voltage-controlled oscillator has a frequency locked loop forming a first feedback path and a phase locked loop forming a second feedback path.

A frequency locked loop has a digital/analog converter, and the phase locked loop has another digital/analog converter and voltage-controlled oscillator VCO.

All of these examples use a voltage controlled oscillator in the circuit design, which is known to be, by nature, an analog device. The problem lies in phase locked loop circuit simulation. The phase-locked loops with their internal feedback loop have special problems, especially, when analog signals are converted into digital form.

For example, in motor speed control, the time lock of the phase locked loop, the characteristics of phase locked loop verification and transistor-level simulation of the phase locked loop are troublesome and optimization of the phase locked loop circuit becomes tedious.

SUMMARY OF THE INVENTION

The present invention overcomes the problems and disadvantages of conventional systems by providing a system which uses feedback to maintain an output digital signal in a specific digital relationship with a reference digital signal to form a digital locked loop. This digital locked loop can lock an input digital signal according to a reference digital signal by using digital counters, a register and an arithmetic logic circuit instead of a phase locked loop or a frequency locked loop. This circuit may be used in an integrated circuit IC for driving a permanent magnetic brushless multi-phase DC motor and is designed not to use a voltage-controlled oscillator. The circuit can be extended to broader applications such as digital data communications, digital image processing, and in the multi-media industry.

A method for controlling a digital locked loop preferably includes the steps of receiving a digital reference signal and a dynamic digital signal, producing an error signal by subtracting the dynamic digital signal from the digital reference signal, determining if the error signal is positive, converting the error signal into an analog signal when the error signal is positive, converting the error signal into a 2's complement and then converting the 2's complement into an analog signal when the error signal is negative, and filtering the analog signal to produce an output signal and transferring the output signal to a charge pump.

BRIEF DESCRIPTION OF THE DRAWINGS

The preferred embodiments of the present invention will now be described more specifically with reference to the attached drawings, wherein.

DESCRIPTION OF THE PREFERRED EMBODIMENT

Reference will now be made in detail to a preferred embodiment of the present invention, an example of which is illustrated in the accompanying drawings. Wherever possible, the same reference numbers will be used throughout the drawings to refer to the same or like parts.

Figure 1:
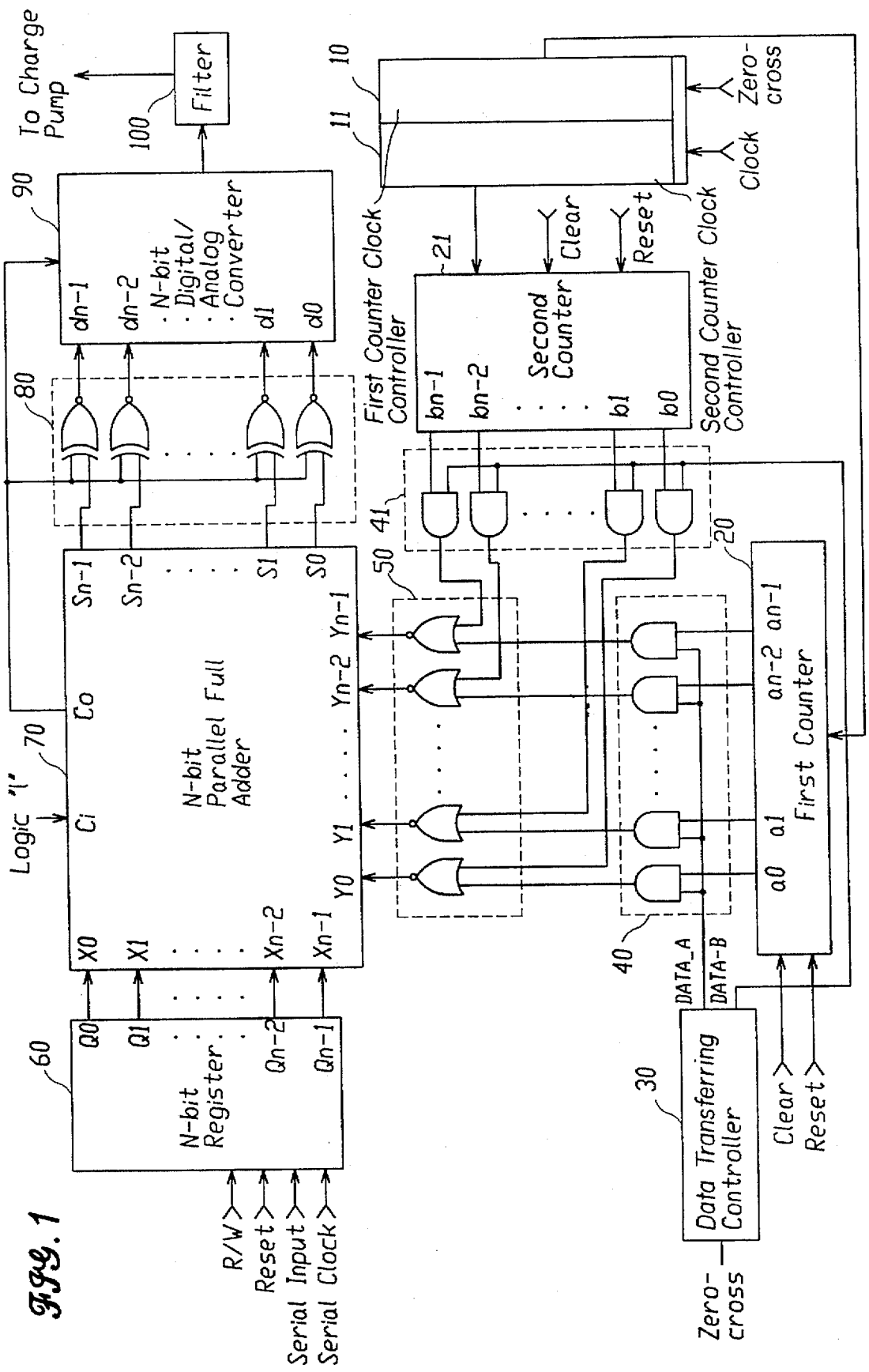
FIG. 1 is a block diagram illustrating a digital locked loop according to a preferred embodiment of the present invention.

Referring to FIG. 1, the digital locked loop includes first and second counter clock controllers 10 and 11 which receive a clock signal and a zero-cross signal and generating a counter clock to be counted by respective first and second counters during periods between zero crossings during which the zero crossing signal has either a logical high value or a logical low value.

First and second counters 20 and 21 are provided and receive a counter clear signal, a reset signal and the counter clock signals produced from the first and second counter clock controllers 10 and 11. These counters 20, 21 alternately count periods of time between zero-crossings with respect to a falling edge and a rising edge of the zero-cross signal.

A data transferring controller 30 receives the zero-cross signal, and generates first and second data transferring control signals DATA_A, DATA_B, so only one counter's data can transfer onto the data bus line during the logical low or high period of time of the zero-cross signal.

A first data transferring circuit 40 receives an output signal of the first counter 20 and the first data transferring control signal DATA_A produced by the data transferring controller 30. The first data transferring circuit transfers the counted data stored in the first counter 20 from the first counter 20 to the 1's complement converter 50 according to the input first data transferring control signal DATA_A during the period of time during which the zero-cross signal is either in the logical low state or logical high state.

A second data transferring circuit 41 receives an output signal from the second counter 21 and the second data transferring control signal DATA_B produced by the data transferring controller 30, and transfers the counted data stored in the second counter 21 from the second counter 21 to the 1's complement converter 50 according to the input second data transferring control signal DATA_B during the period of time during which the zero-cross signal is either in the logical high state or logical low state (opposite that of the first data transferring circuit 40).

A 1's complement converter 50 receives output signals from the first and second data transferring circuits, performs a logical OR operation with the two input signals, which correspond to bit in a proper order, and converts the result of this process into its 1's complement by inverting the result.

A N-bit register 60 receives a read/write signal R/W, a reset signal, a serial clock signal and an external digital serial signal programmed via an external microprocessor or an input-output serial port, and transfers the input digital signal to a next step as a reference digital signal.

A N-bit parallel full adder 70 receives an output signal from the 1's complement converter 50 and the N-bit register 60, receives a logical "1" through the carry bit Ci into the least significant bit position, thereby adding 1 to the least significant bit of the 1's complement to form the 2's complement, and performing subtraction between the reference digital data (minuend) and the transferred digital data (subtrahend) by adding the 2's complement and the reference digital signal input by the N-bit register.

A binary data converter 80 receives the subtracted output from the N-bit parallel full adder 70 and the most significant bit carry bit, and converts the input difference output from the N-bit parallel full adder 70 into binary data by producing the difference according to the sign of the most significant bit carry bit, or converting this difference into its 1's complement.

A N-bit digital/analog converter 90 receives an output signal from the binary data converter and the most significant bit carry bit C0, and converts the digital signal from the binary data converter 80 into an analog signal.

Finally, a filter 100 receives an output signal from the N-bit digital/analog converter 90, to provide a compensation for the digital locked loop.

Referring to FIG. 6, the data transferring controller 30 includes an inverter 31 and first and second NOR gates 32 and 33. The first NOR gate 32 receives the zero-cross signal S and an output from the second NOR gate 33 and produces a first data transferring control signal DATA_A. The second NOR gate 33 receives the zero-cross signal S inverted by the inverter 31 and an output from the first NOR gate 32, and produces a second data transferring control signal DATA_B.

As shown in FIG. 1, the first data transferring circuit 40 includes N AND gates (where N is a natural number) which receive the first data transferring control signal DATA_A produced by the data transferring controller 30 as a common input. The N AND gates further receive N bit output signals a0 to $a_{n-1}$ produced by the first counter 20 as their second respective input signals. The N AND gates thereby determine whether the output signals from the first counter 20 should be transferred according to the input first data transferring control signal DATA_A.

The second data transferring circuit 41 includes N AND gates (where N is a natural number) which receive the second data transferring control signal DATA_B produced by the data transferring controller 30 as a common input. The N AND gates further receive N bit output signal b0 to $b_{n-1}$ produced by the second counter 21 as their second respective input signals. The N AND gates thereby determine whether the output signals from the second counter 21 should be transferred according to the input second data transferring control signal DATA_B.

The 1's complement converter 50 includes N NOR gates (where N is a natural number) which receive the output signals from the first data transferring circuit 40 as one input respectively, and output signals from the second data transferring circuit 41 as another input respectively. The N NOR gates operate on the output signals to form the 1's complement.

The binary data converter 80 includes N EX-NOR gates (where N is a natural number) which receive the most significant carry bit signal C0 from the N-bit parallel full adder 70 as one common input respectively, and receive N sum bit outputs S0 to $S_{n-1}$ as another input respectively (where N is a natural number). These N EX-NOR gates convert the sum bit signal into binary data by performing a buffer function or invert the sum bit signal output according to the most significant bit-carry bit C0.

Figure 10:
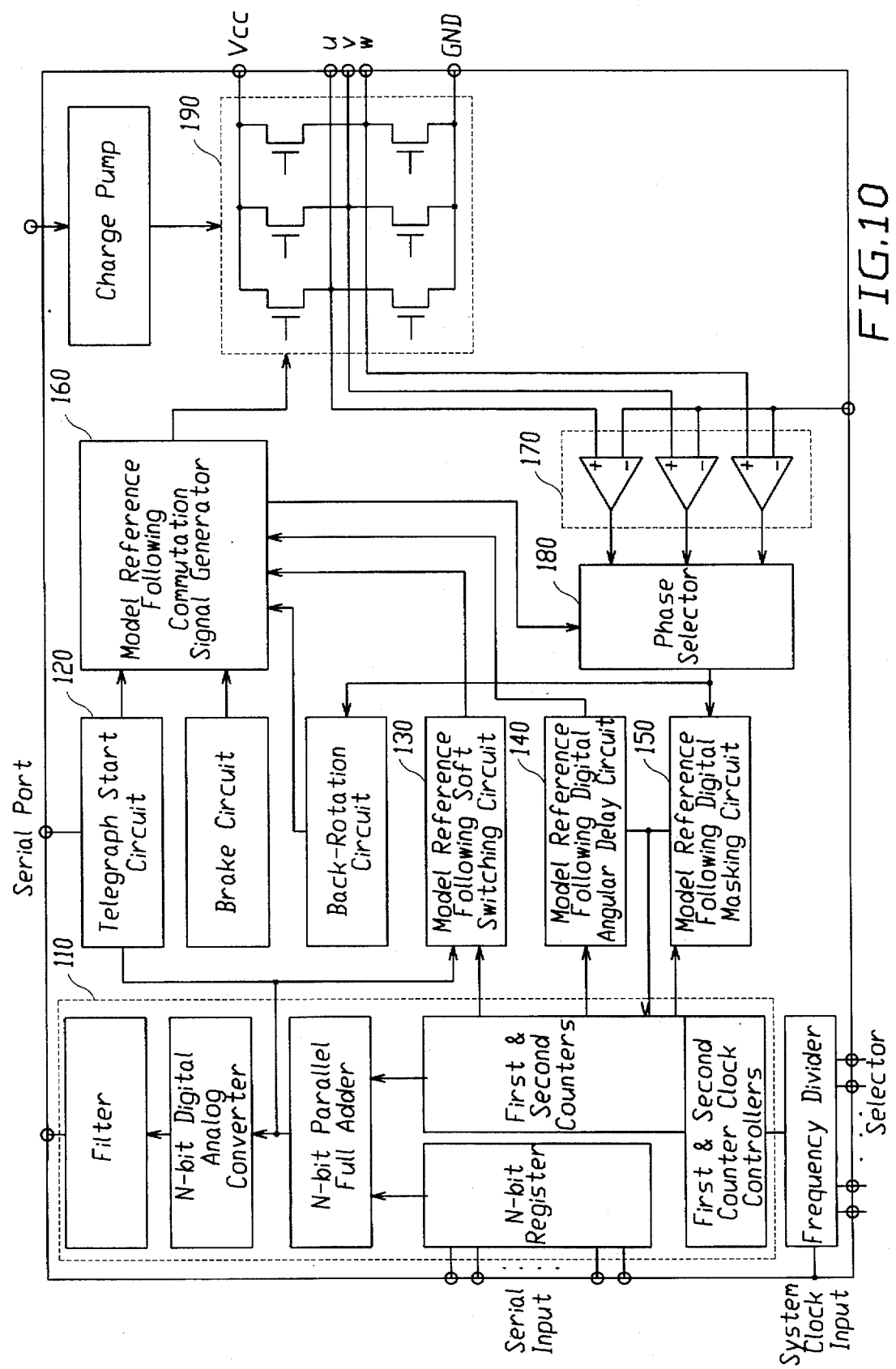
FIG. 10 is a block diagram illustrating generally a hard disc spindle motor drive using the digital locked loop according to a preferred embodiment of the present invention.

Referring to FIG. 10, a hard disc spindle motor drive application using a digital locked loop according to another preferred embodiment of the present invention includes a digital locked loop 110 which can lock an input digital signal according to a reference digital signal by using a digital counter, a register and an arithmetic logic circuit instead of using a voltage-controlled oscillator VCO.

A telegraph start circuit 120 is provided and designed to drive a motor by producing a high starting torque at an initial time of motor starting to overcome disadvantages of a dead point, head-friction and insufficient initial starting torque.

A model reference following soft switching circuit 130 reduces a variation ratio of the switching current, prevents current ripple from being generated by switching, and eliminates the use of a snubber circuit by controlling the ON/OFF time of a switching element in a driving output stage of the motor.

A model reference following digital angular delay circuit 140 locates an optimum switching point (a center point) by delaying the digital angle after detecting a zero-cross point.

A model reference following digital masking circuit 150 masks noise signals produced by power switching and other unknown energy sources.

A model reference following commutation signal generator 160 includes a 6-bit shift register and generates commutation sequential signals with six states to be supplied to the driving output stage of the motor.

A comparator 170 detects back-emf (electromotive force) zero-crossings by comparing each motor phase's back-emf, and changes the voltage of the back-emf to a logic level.

A phase selector 180 receives a commutation signal produced from the model reference commutation signal generator 160, selects the phase of the input signal, and cooperates with the model reference following digital masking circuit 160.

A motor driving circuit 190 receives the commutation signal produced by the model reference commutation signal generator 160, and drives the motor according to the ON/OFF operation of an internal switching element in response to the input commutation signal.

The operation of the digital locked loop will now be explained with reference to accompanying drawings.

Figure 4A:
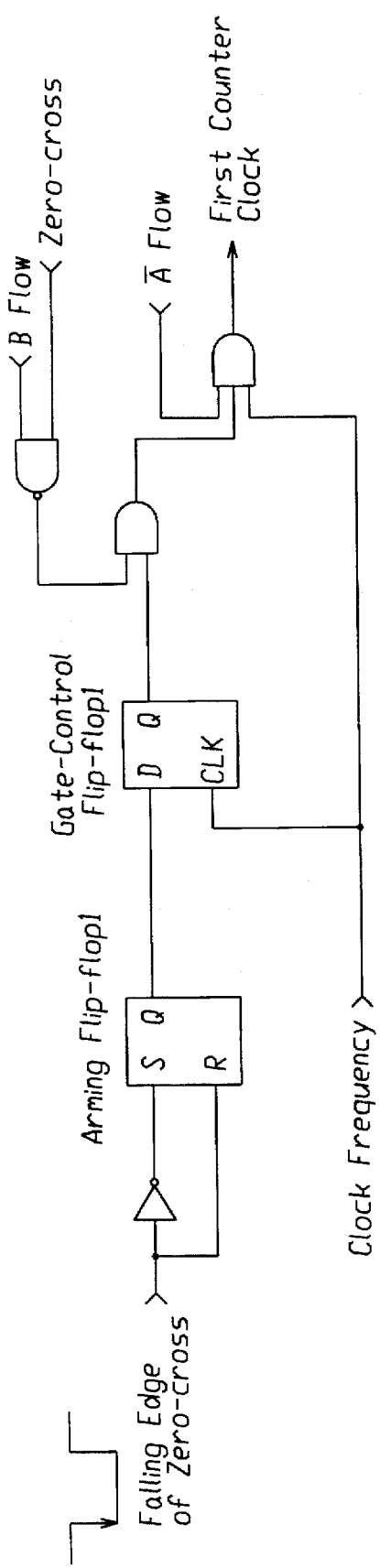
FIG. 4A is a detailed circuit diagram illustrating a first counter clock controller in the digital locked loop of FIG. 1.
Figure 4B:
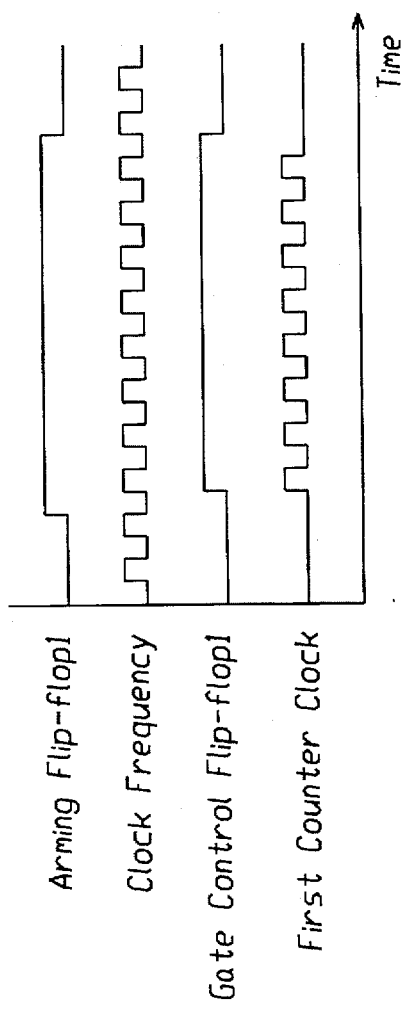
FIG. 4B is a figure illustrating the timing of various signals within the circuit of FIG. 4A.
Figure 5A:
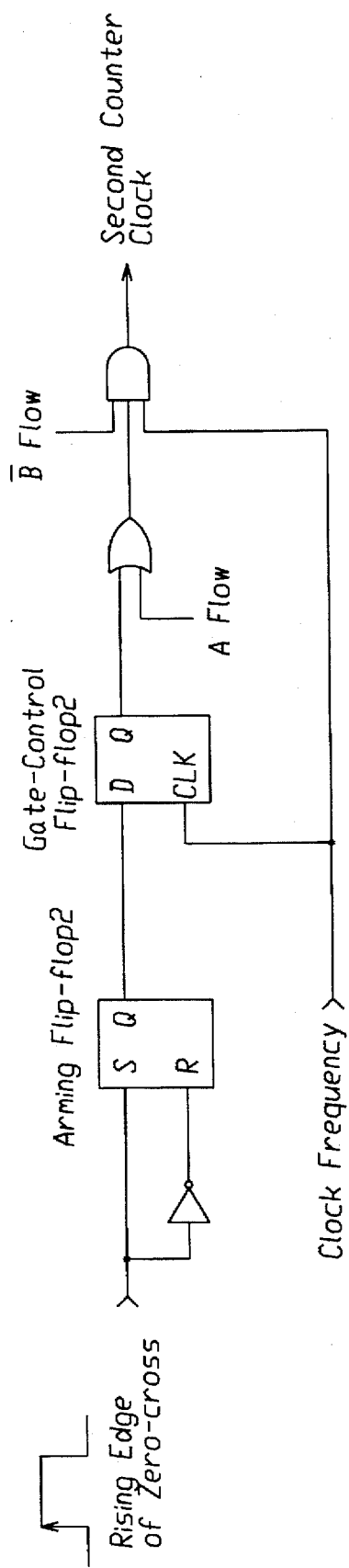
FIG. 5A is a detailed circuit diagram illustrating a second counter clock controller in the digital locked loop of FIG. 1.
Figure 5B:
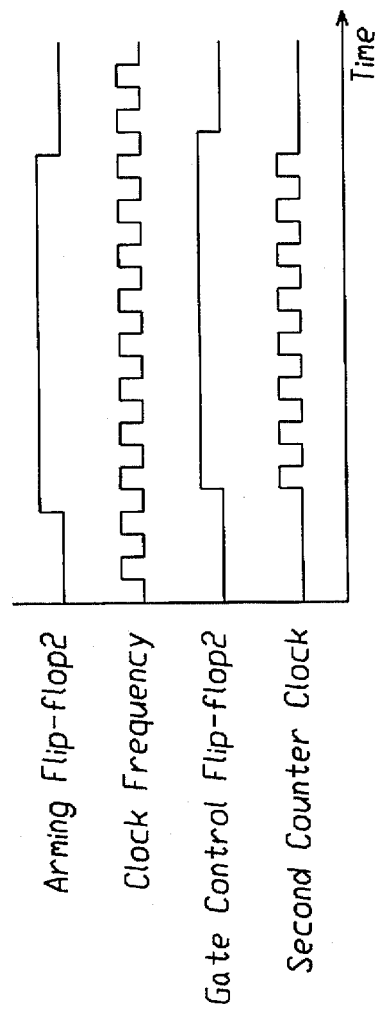
FIG. 5B is a figure illustrating the timing of various signals within the circuit of FIG. 5A.

The first and second counter clock controllers 10 and 11 in FIGS. 4 and 5 supply a counter clock to the first and second counters 20 and 21 in FIG. 1 causing them to alternately operate. The two counter clock controllers 10 and 11 are constructed to be the same. The operation of these counter clock controllers will now be described.

The second counter 21 starts counting a clock signal produced from the second counter clock controller 11 at the rising edge of the zero-cross signal and stops counting at the falling edge of the zero-cross signal.

The first counter 20 operates in opposition to this so that when the second counter stops counting the first counter starts counting. Thus, the first counter 20 starts counting the clock signal from the first counter clock controller 10 at the falling edge of the zero-cross signal and stops counting at the rising edge of the zero-cross signal.

The first and second counters 20 and 21 should be reset before starting another counting period.

The reset operation is carried out at the end of a masking time for masking a noise or a spike signal before the edge of the zero-cross signal is changed while the motor is driven. Alternatively, the reset operation can be performed at the end of a soft switching time in which a continuous soft switching operation is carried out from a special starting point before a switching point for commutation to an extended point after the switching point before the edge of the zero-cross signal is changed while the motor is driven.

Figure 2:
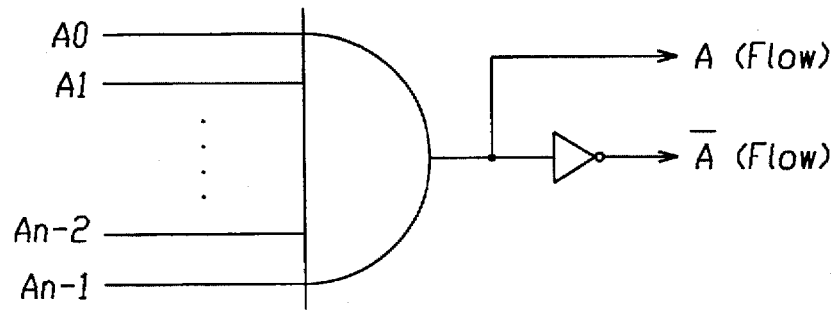
FIG. 2 is a detailed circuit diagram illustrating a first counter overflow control signal generator in the digital locked loop of FIG. 1.
Figure 3:
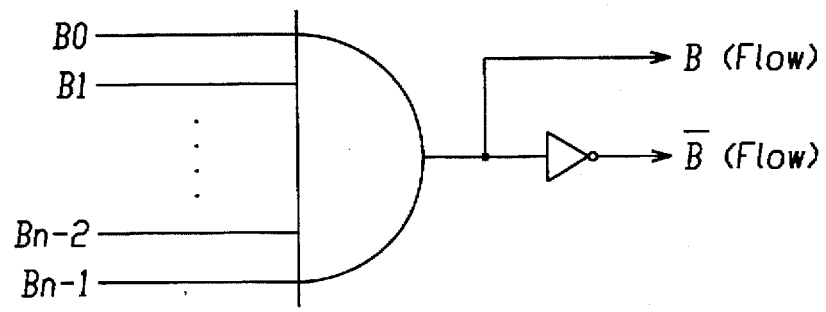
FIG. 3 is a detailed circuit diagram illustrating a second counter overflow control signal generator in the digital locked loop of FIG. 1.

Next, FIG. 2 is a detailed circuit diagram illustrating a first counter overflow control signal generator in the digital locked loop of FIG. 1, and FIG. 3 is a detailed circuit diagram illustrating a second counter overflow control signal generator in the digital locked loop of FIG. 1.

If overflow occurs in the first counter or the second counter, especially when the motor starts, an overflow control signal produced from a first overflow control signal generator or a second overflow control signal generator immediately stops counting the first counter or the second counter, and saves the most recent counting data in the counter.

However, there are two problems to be solved when the overflow occurs in the second counter while the first counter counts.

One is that the zero-cross signal does not occur.

The other is that the zero-cross signal is long even though the zero-cross signal appears. In the first case, the first counter will immediately start counting, and in the second case, the first counter will not start counting until the edge of the zero-cross signal is changed from high to low.

FIG. 1 is a block diagram illustrating a digital locked loop according to a preferred embodiment of the present invention, and shows the whole construction of a digital locked loop system. The digital locked loop system includes two N-bit counters (first and second counters).

The first and second transmission control signals DATA_A and DATA_B produced from the data transmission controller 30 determine whether the data counted by each counter should be transmitted.

Figures 6A, 6B:
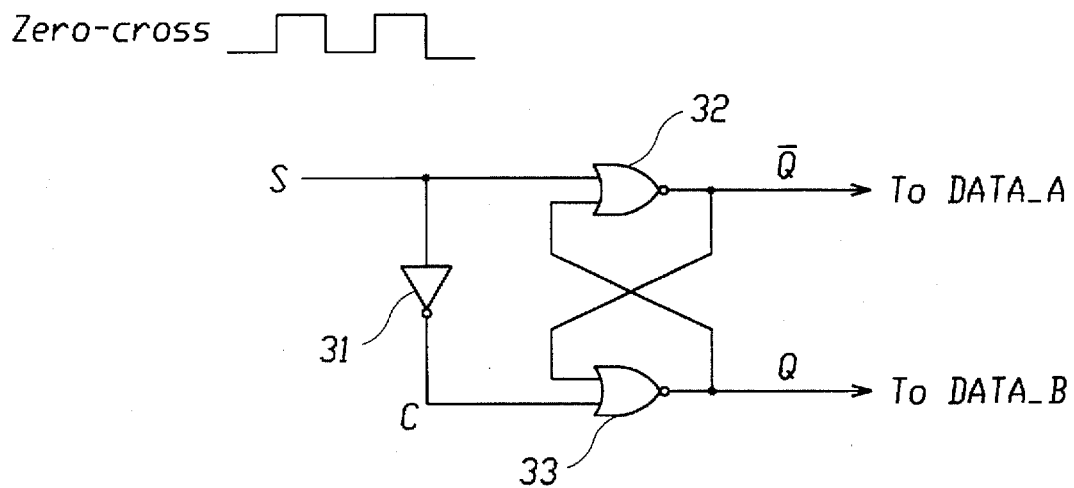
FIG. 6A is a detailed circuit diagram illustrating first and second counter data transmission controllers in the digital locked loop of FIG. 1 and FIG. 6B a logic table of the circuit of FIG. 6A.

FIGS. 6A and 6B are respectively a detailed circuit diagram illustrating first and second counter data transmission controllers in the digital locked loop of FIG. 1 and a logic table for the circuit of FIG. 6A. The operation of the data transmission controller will be described hereinafter with reference to the logic table.

When the input zero-cross signal is "1", the zero-cross signal and a signal inverted by the inverter 31 are input to one input of two NOR gates 32 and 33, thereby the output Q of the NOR gate 33 becomes "1" and the inverted output Q thereof becomes "0".

The output Q from the NOR gate 33 becomes the second data transmission control signal DATA_B, and the inverted output Q thereof becomes the first data transmission control signal DATA_A. In contrast, when the input zero-cross signal is "0", the second data transmission control signal DATA_B becomes "0", and the first data transmission control signal DATA_A becomes "1".

Accordingly, only one counting result of the counter can be transmitted to a next stage according to the logic level of the zero-cross signal. For example, when the zero-cross signal is "1", the second data transmitter 41 illustrated in FIG. 1 is enabled by the second data transmission control signal DATA_B, thereby the counting result of the second counter 21 is transmitted to the 1's complement converter 50, and an output signal from the 1's complement converter 50 is input to the N-bit parallel full adder 70 as subtrahend Y0 to $Y_{n-1}$. Likewise, when the zero-cross signal is "0", the first data transmitter 40 is enabled by the first data transmission control signal DATA_A, thereby the counting result of the first counter 20 is transmitted.

The N-bit register-60 illustrated in FIG. 1 will now be explained in detail.

The N-bit register 60 is a serial port register which is designed to store data input from an external computer or be programmed via an external serial port. For example, a desired motor speed can be input into the serial port register 60 via an input-output serial port. An output signal of the serial port register 60 is then directly input to the N-bit parallel full adder 70 as minuend X0 to $X_{n-1}$.

Figure 7:
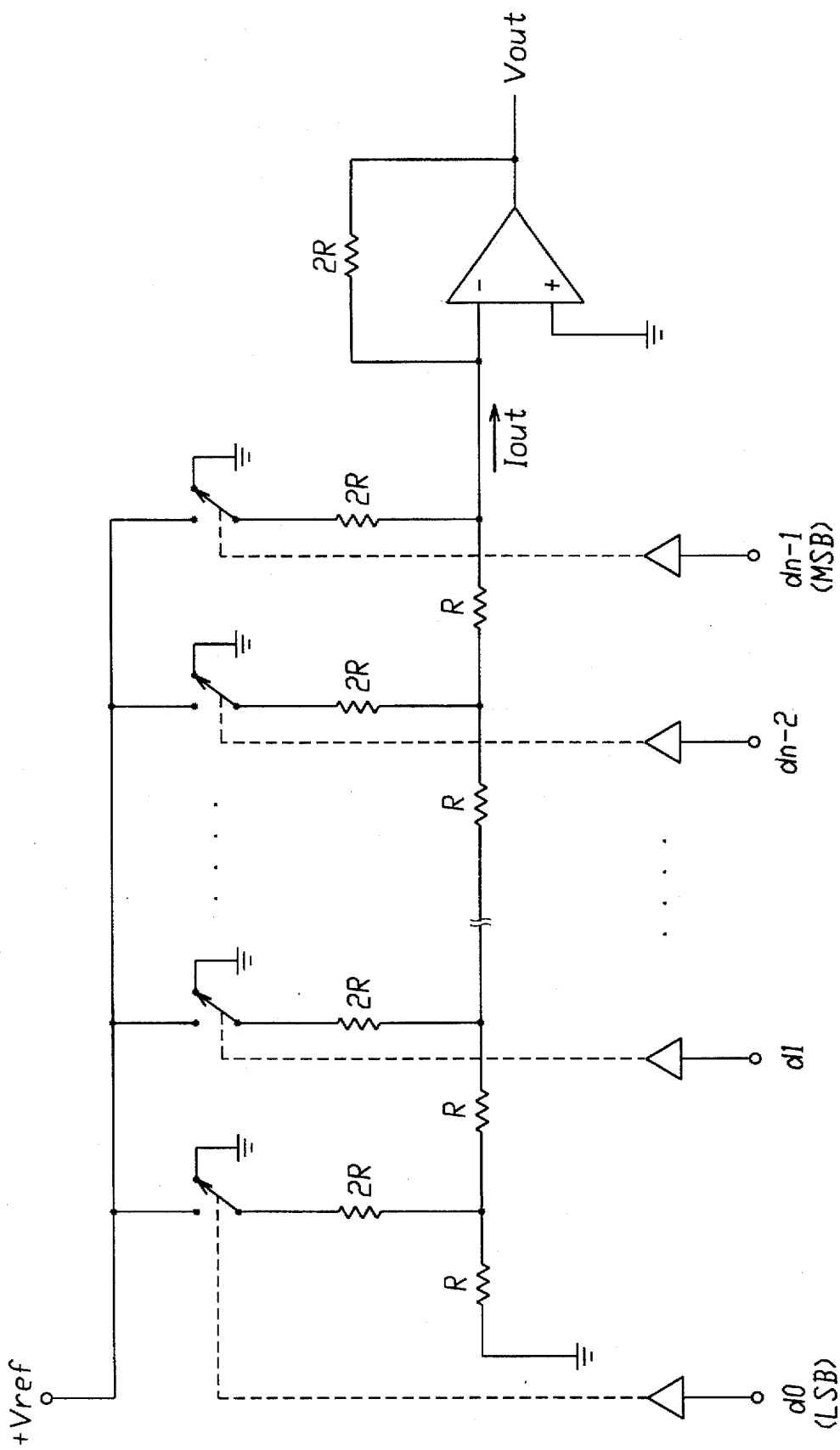
FIG. 7 is a detailed circuit diagram illustrating a digital/ analog converter in the digital locked loop of FIG. 1.

FIG. 7 is a detailed circuit diagram illustrating a digital/analog converter in the digital locked loop of FIG. 1, and is illustrated by an R/2R ladder network (Here, R means a resistor). A user can properly select the R/2R ladder network digital/analog converter in consideration of the performance and the cost of the R/2R ladder network digital/analog converter.

A method for controlling the motor speed using the counter and the N-bit parallel full adder will now be described in detail.

The desired reference speed of the motor can be digitally programmed, or input through an external microcomputer and stored in the N-bit register 60.

A dynamic speed which is counted by the first counter 20 or the second counter 21 can be stored temporally in a parallel counter register (not shown), or directly sent to the N-bit parallel full adder 70 via a data bus controller. The speed difference or error between the dynamic speed and the desired speed can be calculated by the N-bit parallel full adder 70.

A negative number can be represented and the substraction can be performed by using 2's complement system when the speed difference or error between the dynamic speed and the desired speed is calculated by the N-bit parallel full adder 70. When subtracting, the data counted as dynamic motor speed which is to be subtracted is changed into its 2's complement as the subtrahend, and added to minuend (reference speed), which is registered in the serial register.

To change the data counted as the dynamic motor speed into the 2's complement, the data counted as dynamic motor speed is converted first into the 1's complement by the 1's complement converter 50 illustrated in FIG. 1, and the special carry bit Ci of the N-bit parallel full adder 70 is set to logic "1", thereby the substraction by the 2's complement is made. As a result, the output from the N-bit parallel full adder indicates the difference between the dynamic speed and the desired speed of the motor.

The most significant carry bit C0 indicates whether the result of the subtraction is negative or positive. If the most significant carry bit C0 is "1", the result of the subtraction is positive. In this case, the result of the subtraction is in binary form. However, if the most significant carry bit C0 is "0", the result of the subtraction is negative, and is in 2's complement form.

Accordingly, the data of the 2's complement must be converted into binary form. The binary data converter 80 illustrated in FIG. 1 converts the data of the 2's complement into binary data form. The binary data converter 80 includes N EX-NOR gates (where N is a natural number). That is, by comparing the sum bit signal output S0 to $S_{n-1}$ of each N-bit parallel full adder with the most significant carry bit, the binary data converter 80 performs the buffer function when the result of the subtraction is positive (C0="1") and produces the result of the subtraction as it is, and when the result of the subtraction is negative (C0="0"), the binary data converter 80 produces the data of binary form by converting the result of the subtraction into the 1's complement.

As a result, the function of the binary data converter including N EX-NOR gates is to convert the result of subtraction into the data in binary form before the result of the subtraction is sent to the N-bit digital/analog converter 90.

Likewise, the binary data converter 80 can convert the result of subtraction only to the 1's complement when the result of subtraction is positive as describe the above. To convert the 1's complement into the 2's complement, 1 (one) must be added to the produced 1's complement. However, it is costly to use another adder to convert the 1's complement into the 2's complement. Thus, if desired, a trade-off between cost and performance may be made to choose to omit the adder to convert the 1's complement into the 2's complement at this stage. Although this will cause one-bit accuracy to be lost when the result of the subtraction is negative, which means the dynamic rotation speed is slower than the desired rotation speed, this trade-off may be desirable in certain applications, especially where precision need not be absolute.

After forming the 2's complement, an error signal corresponding to the difference between the dynamic speed and the desired speed is obtained and sent to the N-bit digital/analog converter 90. As mentioned the above, the digital/analog converter works as a N-bit digital/analog converter since the signal is the data in binary form when the error is positive. However, when the error is negative, the digital/analog converter works as a N-1-bit digital/analog converter since one-bit accuracy is lost.

This one-bit accuracy loss can be compromised by the length of bits of the digital/analog converter. If the length-bit of the digital/analog converter is long enough, this one-bit loss is minor and therefore can be neglected.

The error of the rotational speed is a series of digital bits in which the carry bit C0 is the sign bit of the result and indicates whether the result is positive (C0="1"), or negative (C0="0"). If the sign is positive, which means that the motor speed is lower than the nominal speed, the motor needs to be accelerated. If the sign bit is negative, which means that the motor speed is faster than the nominal speed, the motor needs to be decelerated. If the error is zero, which means that the motor speed is correct, no further action needs to be taken.

Figure 8:
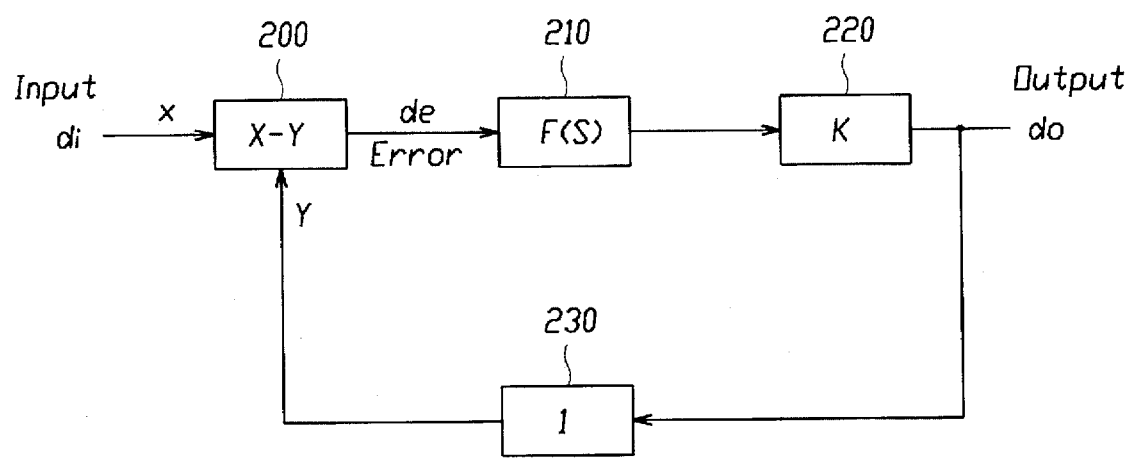
FIG. 8 is a block diagram conceptually illustrating the general operation of the digital locked loop of FIG. 1.

FIG. 8 is a block diagram which conceptually illustrates the general operation of the digital locked loop of FIG. 1.

Block 200 illustrated in FIG. 8 shows the subtraction operation of a reference speed X of the motor and a dynamic speed Y by the N-bit parallel full adder. Block 210 represents a loop filter transfer function F(s), block 220 represents a conversion gain K according to the digital/analog conversion and block 230 represents a unit feedback gain 1.

The loop filter is a circuit used to control the digital locked loop dynamics and therefore the performance of the system. The F(s) term is used to denote the Laplace transfer function of the filter.

A closed-loop transfer function of the digital locked loop illustrated in FIG. 8 can be expressed by equation (1):

$$H(s)=do(s)/di(s)=KF(s)/\{s+KF(s)\} \qquad (1)$$

where,

H(s) is the closed-loop transfer function, s is a Laplace variable, di(s) is a reference input signal, do(s) is an output signal, K is the conversion gain, and F(s) is the loop filter transfer function.

The loop error function can be expressed by equation (2):

$$\{di(s)-do(s)\}/di(s)=de(s)/di(s)=s/\{s+KF(s)\} \qquad (2)$$

where, de(s) is a loop error signal.

An open loop transfer function G(s) of the digital locked loop illustrated in FIG. 8 can be expressed by equation (3):

$$G(s)=KF(s)/s \qquad (3)$$

Figure 9:
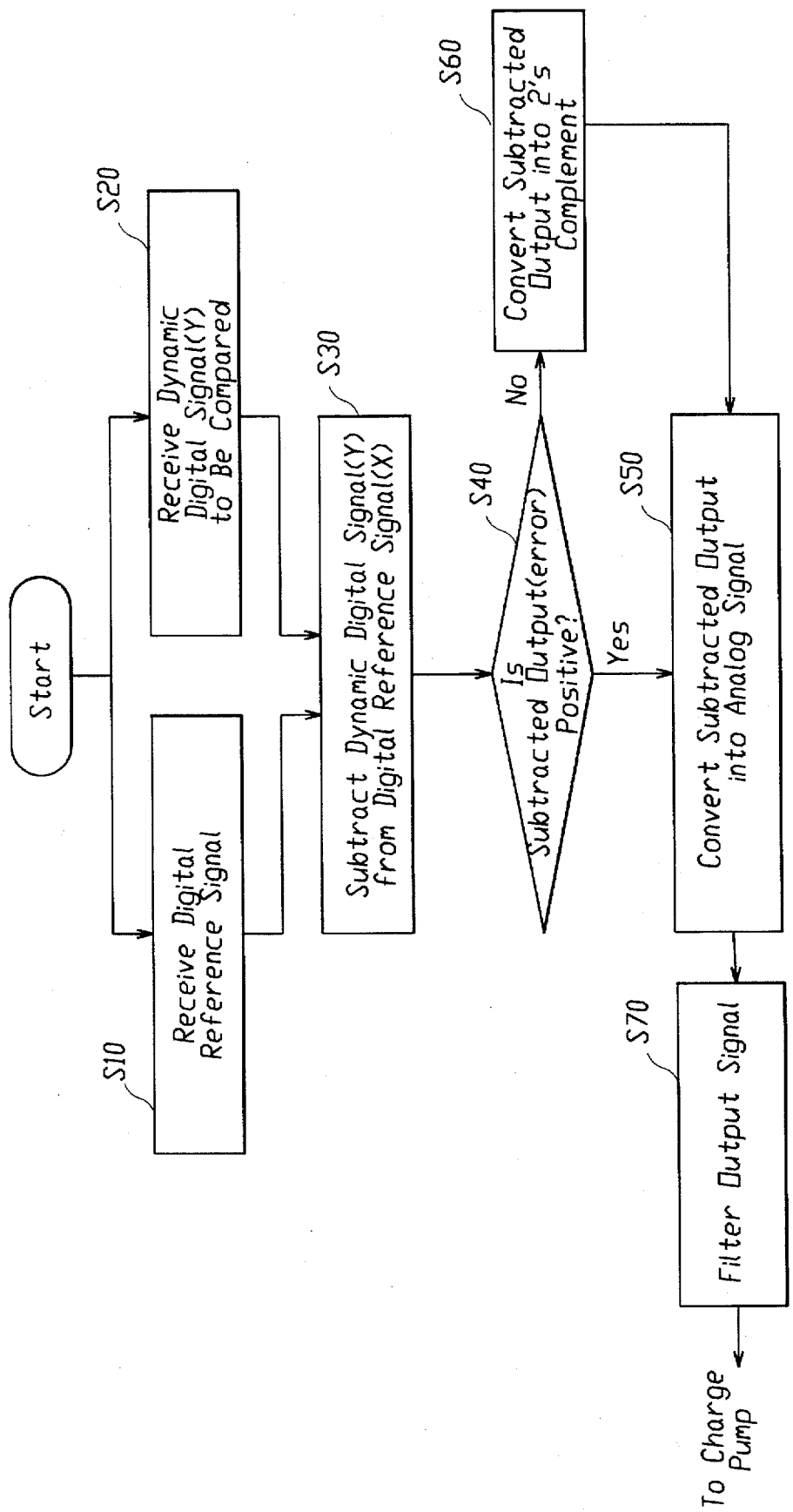
FIG. 9 is a flow chart of the steps in a method for controlling the digital locked loop of FIG. 1.

A method for controlling the digital locked loop system according to the preferred embodiment of the present invention will now be described in detail, with particular reference to FIG. 9 which is a flow chart illustrating steps in the method for controlling the digital locked loop of FIG. 1.

First, the digital reference signal X is input (Step 10) and the dynamic digital signal Y to be compared with the input digital reference signal X is input (Step 20). The dynamic digital signal Y is then subtracted from the input digital reference signal X (Step 30).

The digital locked loop system determines whether the error signal which is produced as the result of the subtraction is positive (Step 40). If the error signal is positive, the N-bit digital/analog converter 90 converts the error signal into an analog signal (Step 50). However, if the error signal is not positive, the error signal is converted into the 2's complement (Step 60) and transferred to the N-bit digital/analog converter 90 where it is converted into an analog signal (Step 50). The output signal of the N-bit digital/analog converter 90 is filtered and transmitted to a charge pump (Step 70).

FIG. 10 is a block diagram illustrating the digital locked loop in a hard disc spindle motor drive according to a preferred embodiment of the present invention, and shows the digital locked loop system to which a telegraph start circuit, a model reference following soft switching circuit, a digital angular delay circuit and a digital masking circuit are connected.

The digital locked loop system according to the preferred embodiment of the present invention uses feedback to maintain a special digital relation between the reference digital signal and the dynamic digital signal.

As described above, in the preferred embodiment of the present invention, the disadvantages of the conventional art are overcome by providing a digital locked loop system which can lock the input digital signal according to the reference digital signal by using a digital counter, a register and an arithmetic logic circuit instead of a phase locked loop and a frequency locked loop in motor drive integrated circuit for permanent magnetic brushless DC multi-phase motor drive applications. The circuit is designed so that a voltage-controlled oscillator is not required.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What we claim is:

1. A hard disc spindle motor drive using a digital locked loop, comprising:

a digital locked loop which can lock an input digital signal according to a reference digital signal by using a digital counter, a register and an arithmetic logic circuit;

a telegraph start circuit designed for driving a motor by producing a high starting torque at an initial time of motor starting to overcome disadvantages of dead point, head-friction and insufficient initial starting torque;

a model reference following soft switching circuit which reduces variation ratio of switching current, prevents current ripple generated by switching, and eliminates the use of a snubber circuit by controlling ON/OFF time of a switching element in a driving output stage of the motor;

a model reference following digital angular delay circuit for finding an optimum switching point by delaying a digital angle after detecting a zero-cross point;

a model reference following digital masking circuit for masking noise signals produced by power switching and other energy sources;

a model reference following commutation signal generator including a 6-bit shift register and for generating commutation sequential signals with six states to be supplied to the driving output stage of the motor;

a comparator for detecting back-emf (electromotive force) zero-cross by comparing each motor phase's back-emf, and change the voltage of back-emf to a logic level;

a phase selector for receiving a commutation signal produced from the model reference commutation signal generator, selecting the phase of the input signal, and cooperating with the model reference following digital masking circuit; and a motor driving circuit for receiving the commutation signal produced from the model reference commutation signal generator, and driving the motor according to the ON/OFF operation of an internal switching element in response to the input commutation signal.

2. A digital locked loop, comprising:

first and second counter clock controllers which each receive a clock signal and a zero-cross signal and respectively generate first and second counter clock signals;

a first counter which counts a period of time between a rising edge and a falling edge of a zero-cross signal and outputs a first digital signal;

a second counter which counts a period of time between the falling edge and the rising edge of the zero-cross signal and outputs a second digital signal;

a 1's complement converter which alternately receives said first digital signal and said second digital signal and forms a 1's complement signal of said received signal;

a N-bit adder which receives the 1's complement signal and a reference digital signal, forms a 2's complement signal from said 1's complement signal and adds said 2'1 complement signal to said reference digital signal to thereby form an output signal;

a converter which receives the digital output signal and outputs a signal in analog form; and a filter which receives the analog signal and provides compensation for the digital locked loop.

3. A digital locked loop, comprising:

first and second counter clock controllers which each receive a clock signal and a zero-cross signal and respectively generate first and second counter clock signals;

first and second counters which each receive a counter clear signal, a reset signal and which respectively receive said first and second counter clock signals produced by the first and second counter clock controllers, and which alternately count periods of time between rising and falling edges of the zero-cross signal;

a data transfer controller which receives the zero-cross signal, and generates first and second data transfer control signals, so that only one of said first and second counters may transfer data onto a data bus line during a logical high period of time or a logical low period of time of the zero-cross signal;

a first data transfer which receives an output signal of the first counter and the first data transfer control signal produced by the data transfer controller, and outputs a signal corresponding to counted data stored in the first counter from the first counter according to the input first data transfer control signal under the logical low period of time of the zero-cross signal;

a second data transfer which receiving an output signal from the second counter and the second data transfer control signal produced by the data transfer controller, and outputs a signal corresponding to counted data stored in the second counter from the second counter according to the input second data transfer control signal under the logical high period of time of the zero-cross signal;

a 1's complement converter which receives output signals from the first and second data transfers, performs a logical OR operation on the input signals corresponding to each bit in a proper order, and converts the result into an 1's complement signal by inverting the result;

a N-bit register which receives a read/write signal, a reset signal, a serial clock signal and an external digital serial signal programmed via an external micro-processor or an input-output serial port, and outputs a reference digital signal;

a N-bit adder which receives the 1's complement signal and the reference digital signal, receives a logical "1" through a carry bit signal and inputs this logical "1" into the least significant bit position, thereby adding 1 to the least significant bit of the 1's complement to form a 2's complement, and which subtracts the transferred digital data from the reference digital data by adding the 2's complement and the reference digital signal input by the N-bit register;

a binary data converter which receives the subtracted output from the N-bit adder and a most significant bit carry bit, and converts the input difference output from the N-bit adder into binary data by producing one of the difference without variation and a 1's complement of the difference according to the value of most significant bit carry bit;

a N-bit digital/analog converter which receives an output signal from the binary data converter and the most significant bit carry bit, and converts the digital signal from the binary data converter into an analog signal; and a filter which receives an output signal from the N-bit digital/analog converter, and provides compensation for the digital locked loop.

4. The digital locked loop of claim 3, wherein the data transfer controller includes an inverter and first and second NOR gates;

the first NOR gate receives the zero-cross signal and an output from the second NOR gate, and produces a first data transferring control signal by performing a logical NOR operation; and the second NOR gate receives the zero-cross signal after being inverted by the inverter and an output from the first NOR gate, and produces a second data transferring control signal by performing a logical NOR operation.

5. The digital locked loop of claim 3, wherein the first data transfer circuit includes N AND gates, where N is a natural number, said N AND gates respectively receive the first data transfer control signal produced from the data transfer controller as one input and respectively receive N-bit output signals produced from the first counter as another input, to thereby determine whether the output signal from the first counter should be transferred according to the input first data transfer control signal.

6. The digital locked loop of claim 1, wherein the second data transfer circuit includes N AND gates, where N is a natural number, said N AND gates respectively receive the second data transfer control signal produced from the data transfer controller as one input and respectively receive N-bit output signals produced from the second counter as another input, to thereby determine whether the output signal from the second counter should be transferred according to the input second data transfer control signal.

7. The digital locked loop of claim 3, wherein the 1's complement converter includes N NOR gates, where N is the natural number, which respectively receive output signals from the first data transfer as one input and respectively receive output signals from the second data transfer as another input, perform a logical OR operation on the two signals and inverts the results of the logical OR operation to thereby form a 1's complement.

8. The digital locked loop of claim 3, wherein the binary data converter includes N EX-NOR gates, where N is a natural number, which respectively receive the most significant bit carry bit from the N-bit adder as one input and respectively receive N sum bit outputs as another input, and which form binary data by either buffering the data or by inverting the sum bit signal outputs according to the input most significant bit carry bit.

9. The digital locked loop of claim 3, wherein the N-bit adder is a N-bit parallel full adder.

10. The digital locked loop of claim 3, wherein the transfer function is represented by the following equation:

$$H(s)=do(s)/di(s)=KF(s)/\{s+KF(s)\}$$

where,

H(s) is the closed-loop transfer function, s is a Laplace variable, di(s) is a reference input signal, do(s) is an output signal, K is the conversion gain, and F(s) is the loop filter transfer function.

11. The digital locked loop of claim 3, wherein the loop error signal is represented by the following equation:

$$\{di(s)-do(s)\}/di(s)=de(s)/di(s)=s/\{s+KF(s)\}.$$

12. The digital locked loop of claim 3, wherein the open loop transfer function, G(s) is expressed by the following equation:

$$G(s)=KF(s)/s.$$

13. A method for controlling a digital locked loop, comprising the steps of:

receiving a digital reference signal and a dynamic digital signal;

producing an error signal by subtracting the dynamic digital signal from the digital reference signal;

determining if the error signal is positive;

converting the error signal into an analog signal when the error signal is positive;

converting the error signal into a 2's complement and then converting the 2's complement into an analog signal when the error signal is negative; and filtering the analog signal to produce an output signal and transferring the output signal to a charge pump.

* * * * *